(12) United States Patent
Benson

(10) Patent No.: US 8,641,831 B2
(45) Date of Patent: Feb. 4, 2014

(54) NON-CHEMICAL, NON-OPTICAL EDGE BEAD REMOVAL PROCESS

(75) Inventor: Peter A. Benson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/475,515

(22) Filed: May 18, 2012

(65) Prior Publication Data

US 2012/0234361 A1 Sep. 20, 2012

Related U.S. Application Data

(62) Division of application No. 10/335,279, filed on Dec. 31, 2002, now Pat. No. 8,192,555.

(51) Int. Cl.
*B08B 3/00* (2006.01)
*B08B 7/00* (2006.01)

(52) U.S. Cl.
USPC ................................. 134/37; 134/32; 134/34

(58) Field of Classification Search
None
See application file for complete search history.

(56) References Cited

U.S. PATENT DOCUMENTS

| | | | |
|---|---|---|---|
| 4,775,883 A * | 10/1988 | Borchert et al. | 257/168 |
| 4,806,171 A | 2/1989 | Whitlock et al. | |
| 5,062,898 A | 11/1991 | McDermott et al. | |
| 5,145,717 A | 9/1992 | Drury et al. | |
| 5,294,261 A | 3/1994 | McDermott et al. | |
| 5,349,978 A | 9/1994 | Sago et al. | |
| 5,372,652 A | 12/1994 | Srikrishnan et al. | |
| 5,398,372 A * | 3/1995 | Kush | 15/309.1 |
| 5,431,332 A | 7/1995 | Kirby et al. | |
| 5,512,106 A | 4/1996 | Tamai | |
| 5,567,655 A | 10/1996 | Rostoker et al. | |
| 5,608,943 A | 3/1997 | Konishi et al. | |
| 5,618,380 A | 4/1997 | Siems et al. | |
| 5,667,928 A | 9/1997 | Thomas et al. | |
| 5,792,275 A | 8/1998 | Natzle et al. | |
| 5,810,942 A | 9/1998 | Narayanswami et al. | |
| 5,853,962 A | 12/1998 | Bowers | |
| 5,904,164 A | 5/1999 | Wagner et al. | |
| 5,931,721 A | 8/1999 | Rose et al. | |
| 5,939,139 A * | 8/1999 | Fujimoto | 427/240 |
| 5,952,050 A | 9/1999 | Doan | |
| 5,985,363 A * | 11/1999 | Shiau et al. | 427/240 |
| 6,062,084 A | 5/2000 | Chang et al. | |
| 6,063,439 A | 5/2000 | Semba et al. | |

(Continued)

FOREIGN PATENT DOCUMENTS

| | | |
|---|---|---|
| EP | 0712692 A1 | 5/1996 |
| JP | 2000138187 A | 5/2000 |
| JP | 2002124508 A * | 4/2002 |
| WO | 0194037 A1 | 12/2001 |

OTHER PUBLICATIONS

English Machine Translation of JP 2002-124508 A.*
Definition of Solvent from Dictionary.com.*

(Continued)

*Primary Examiner* — Nicole Blan
(74) *Attorney, Agent, or Firm* — TraskBritt

(57) ABSTRACT

A method for removing the edge bead from a substrate by applying an impinging stream of a medium that is not a solvent for the material to be removed. The medium is applied to the periphery of the substrate with sufficient force to remove the material. Also, an apparatus to perform the inventive method.

18 Claims, 1 Drawing Sheet

(56) References Cited

U.S. PATENT DOCUMENTS

| | | | |
|---|---|---|---|
| 6,105,589 A | 8/2000 | Vane et al. | |
| 6,117,486 A | 9/2000 | Yoshihara | |
| 6,140,287 A * | 10/2000 | Lee | 510/175 |
| 6,202,658 B1 | 3/2001 | Fishkin et al. | |
| 6,255,228 B1 | 7/2001 | Rolfson | |
| 6,258,688 B1 | 7/2001 | Tsai | |
| 6,261,427 B1 | 7/2001 | Rolfson | |
| 6,267,817 B1 | 7/2001 | Gonzalez | |
| 6,282,812 B1 | 9/2001 | Wee et al. | |
| 6,284,676 B1 | 9/2001 | Whitman | |
| 6,322,954 B1 | 11/2001 | Li | |
| 6,365,531 B1 * | 4/2002 | Hayashi et al. | 134/94.1 |
| 6,399,412 B1 * | 6/2002 | Asai et al. | 438/63 |
| 6,412,326 B1 | 7/2002 | Hubbard | |
| 6,436,851 B1 * | 8/2002 | Young et al. | 438/782 |
| 6,446,358 B1 * | 9/2002 | Mitsumori et al. | 34/611 |
| 6,449,873 B1 * | 9/2002 | Yoon et al. | 34/448 |
| 6,453,916 B1 * | 9/2002 | Tran et al. | 134/58 R |
| 6,565,920 B1 * | 5/2003 | Endisch | 427/240 |
| 6,612,319 B1 | 9/2003 | Rangarajan et al. | |
| 6,837,967 B1 | 1/2005 | Berman et al. | |
| 8,192,555 B2 | 6/2012 | Benson | |
| 2002/0033381 A1 | 3/2002 | Nakabayashi et al. | |
| 2003/0070694 A1 * | 4/2003 | McCleary et al. | 134/8 |
| 2003/0073309 A1 | 4/2003 | Emami | |
| 2003/0077984 A1 | 4/2003 | Smith et al. | |

OTHER PUBLICATIONS

Merriam-Webster's Collegiate Dictionary, Tenth Edition, 1999, p. 366.

Hawley's Condensed Chemical Diction, Twelfth Edition, 1993, p. 26.

* cited by examiner

NON-CHEMICAL, NON-OPTICAL EDGE BEAD REMOVAL PROCESS

CROSS-REFERENCE TO RELATED APPLICATION

This application is a division of U.S. patent application Ser. No. 10/335,279, filed Dec. 31, 2002, now U.S. Pat. No. 8,192,555, issued Jun. 5, 2012.

BACKGROUND OF THE INVENTION

The invention relates generally to the manufacture of semiconductor devices. More particularly, the invention relates to a non-solvent system for semiconductor wafer processes such as removing the edge bead formed during spin coating processes.

Coating materials such as photoresist are typically applied to a semiconductor wafer by flowing liquid coating material onto the top surface of the wafer while it is spinning. The wafer is held on a disk shaped, rotating spin chuck. The diameter of the chuck is slightly less than the diameter of the wafer. The chuck is positioned so that the wafer lies on the chuck in a level horizontal plane. In operation, the backside or inactive surface of the wafer is placed onto the chuck. The chuck applies a suction to the backside of the wafer to hold the wafer in place on the chuck. The chuck is rotated by a motor-driven axle that extends down from the chuck. As the wafer is rotated on the chuck, liquid photoresist material is applied to the center of the wafer. The photoresist spreads radially outward from the center of the wafer towards the edge to coat the top of the wafer. Ideally, all excess coating material is ejected from the edge of the wafer. In practice, however, some excess photoresist tends to collect at and form a bead along the edge of the wafer.

Processes to remove the edge bead are known. Typically, a solvent is dispensed along the edge of the wafer to dissolve the edge bead and remove the resist from the extreme edge of the wafer. If necessary, the coating is exposed to light prior to contact with the solvent, or developer in order to develop the coating and render it soluble in the solvent. The solvent may be dispensed through a nozzle directed toward the backside edge of the wafer, in which case it wicks up around to the top of the wafer to dissolve the edge bead, or the solvent may be dispensed directly onto the top edge of the wafer. In either case, the process allows solvent and dissolved photoresist to be splashed about and often leaves a jagged edge profile on the photoresist or other coating material. In the process of U.S. Pat. No. 5,952,050, the method includes the steps of dispensing a solvent selectively onto the edge of the wafer to dissolve the coating material at the extreme edge of the wafer, and applying a suction to vacuum excess solvent and dissolved coating material from the wafer.

BRIEF SUMMARY OF THE INVENTION

The current invention is an edge bead removal method that does not require the use of solvents or optical processing. In one preferred embodiment, the invention is a method comprising the steps of providing a substrate having an outer edge wherein at least one material forms a coating layer on the outer edge of the substrate; and removing material from the coating layer by impinging the coated outer edge with a stream of a medium that is not a solvent for the material.

In another preferred embodiment, an edge bead removal method, the method comprising the steps of providing a substrate having an outer edge wherein at least one material forms a coating layer on the outer edge of the substrate and removing material from the coating layer by impinging the coated outer edge with a stream of a medium that is not a solvent for the material.

In yet another preferred embodiment, an edge bead removal method, the method comprising the steps of providing a substrate having an outer edge wherein at least one material forms a coating layer on the outer edge of the substrate and removing material from the coating layer by impinging the coated outer edge with a stream of a gas that is not a solvent for the material.

In a further preferred embodiment, the invention is an edge bead removal method, the method comprising the steps of providing a substrate having an outer edge wherein at least one material forms a coating layer on the outer edge of the substrate and removing material from the coating layer by impinging the coated outer edge with a stream of an aerosol that is not a solvent for the material.

In another preferred embodiment, the invention is an edge bead removal method, the method comprising the steps of providing a substrate having an outer edge and an underside, wherein at least one material forms a coating layer on the outer edge of the substrate; removing material from the coating layer by impinging the coated outer edge with a stream of a medium that is not a solvent for the material; and applying a cleaning solution to the outer edge or underside of the substrate to remove from the periphery any residue remaining after the removal step.

Another preferred embodiment of the invention is an edge bead removal method, the method comprising the steps of providing a substrate having an outer edge and an underside, wherein at least one material forms a coating layer on the outer edge of the substrate; removing material from the coating layer by impinging the coated outer edge with a stream of a gas which is not a solvent for the material; and applying a cleaning solution to the outer edge or underside of the substrate to remove from the periphery any residue remaining after the removal step.

A further preferred embodiment of the invention is an edge bead removal method, the method comprising the steps of providing a substrate having an outer edge and an underside, wherein at least one material forms a coating layer on the outer edge of the substrate; removing material from the coating layer by impinging the coated outer edge with a stream of an aerosol that is not a solvent for the material; and applying a cleaning solution to the outer edge or underside of the substrate to remove from the periphery any residue remaining after the removal step.

Another preferred embodiment of the invention is an edge bead removal method, the method comprising the steps of providing a substrate having an outer edge wherein at least one material forms a coating layer on the outer edge of the substrate; forming a directed stream of a non-dissolving medium; and aiming the stream of a non-dissolving medium to impinge the coated outer edge thereby removing material from the coating layer.

Yet another preferred embodiment of the invention is an edge bead removal method, the method comprising the steps of providing a substrate having an outer edge wherein at least one material forms a coating layer on the outer edge of the substrate; forming a directed stream of a non-dissolving gas; and aiming the stream of a non-dissolving medium to impinge the coated outer edge thereby removing material from the coating layer.

Another preferred embodiment of the invention is an edge bead removal method, the method comprising the steps of providing a substrate having an outer edge wherein at least one material forms a coating layer on the outer edge of the substrate; forming a directed stream of a non-dissolving aerosol; and aiming the stream of a non-dissolving medium to impinge the coated outer edge thereby removing material from the coating layer.

In a further preferred embodiment, the invention is an edge bead removal method, the method comprising the steps of providing a substrate having an outer edge wherein at least one material forms a coating layer on the outer edge of the substrate; forming a directed stream of a non-dissolving medium; aiming the stream of a non-dissolving medium to impinge the coated outer edge thereby removing material from the coating layer; and applying a cleaning solution to the periphery or underside of the substrate to remove from the periphery any residue remaining after the removal step.

In yet a further preferred embodiment, the invention is an edge bead removal method, the method comprising the steps of providing a substrate having an outer edge wherein at least one material forms a coating layer on the outer edge of the substrate; forming a directed stream of a non-dissolving gas; aiming the stream of a non-dissolving gas to impinge the coated outer edge thereby removing material from the coating layer; and applying a cleaning solution to the periphery or underside of the substrate to remove from the periphery any residue remaining after the removal step.

In another preferred embodiment, the invention is an edge bead removal method, the method comprising the steps of providing a substrate having an outer edge wherein at least one material forms a coating layer on the outer edge of the substrate; forming a directed stream of a non-dissolving aerosol; aiming the stream of a non-dissolving aerosol to impinge the coated outer edge thereby removing material from the coating layer; and applying a cleaning solution to the periphery or underside of the substrate to remove from the periphery any residue remaining after the removal step.

In a further preferred embodiment, the invention is an edge bead removal method, the method comprising the steps of providing a substrate having an outer edge wherein at least one material forms a coating layer on the outer edge of the substrate; providing means for forming a directed stream of a non-dissolving medium; forming a directed stream of a non-dissolving medium; aiming the stream of a non-dissolving medium to impinge the coated outer edge thereby removing material from the coating layer; and applying a cleaning solution to the periphery or underside of the substrate to remove from the periphery any residue remaining after the removal step.

In yet another preferred embodiment, the invention is an edge bead removal method, the method comprising the steps of providing a substrate having an outer edge wherein at least one material forms a coating layer on the outer edge of the substrate; providing means for forming a directed stream of a non-dissolving medium; forming a directed stream of a non-dissolving gas; aiming the stream of a non-dissolving gas to impinge the coated outer edge thereby removing material from the coating layer; and applying a cleaning solution to the periphery or underside of the substrate to remove from the periphery any residue remaining after the removal step.

In another preferred embodiment, the invention is an edge bead removal method, the method comprising the steps of providing a substrate having an outer edge wherein at least one material forms a coating layer on the outer edge of the substrate; providing means for forming a directed stream of a non-dissolving medium; forming a directed stream of a non-dissolving aerosol with the stream forming means; aiming the stream of a non-dissolving aerosol to impinge the coated outer edge thereby removing material from the coating layer; and applying a cleaning solution to the periphery or underside of the substrate to remove from the periphery any residue remaining after the removal step.

In another preferred embodiment, the invention is an edge bead removal method, the method comprising the steps of providing a substrate having an outer edge wherein at least one material forms a coating layer on the outer edge of the substrate; providing an air knife or nozzle aimed at the outer edge of the substrate; forming a directed stream of a non-dissolving medium; aiming the stream of a non-dissolving medium to impinge the coated outer edge thereby removing material from the coating layer; and applying a cleaning solution to the periphery or underside of the substrate to remove from the periphery any residue remaining after the removal step.

In another preferred embodiment, the invention is an edge bead removal method, the method comprising the steps of providing a substrate having an outer edge wherein at least one material forms a coating layer on the outer edge of the substrate; providing an air knife or nozzle aimed at the outer edge of the substrate; forming a directed stream of a non-dissolving gas; aiming the stream of a non-dissolving gas to impinge the coated outer edge thereby removing material from the coating layer; and applying a cleaning solution to the periphery or underside of the substrate to remove from the periphery any residue remaining after the removal step.

Another preferred embodiment of the invention is an edge bead removal method, the method comprising the steps of providing a substrate having an outer edge wherein at least one material forms a coating layer on the outer edge of the substrate; providing an air knife or nozzle aimed at the outer edge of the substrate; forming a directed stream of a non-dissolving aerosol; aiming the stream of a non-dissolving aerosol to impinge the coated outer edge thereby removing material from the coating layer; and applying a cleaning solution to the periphery or underside of the substrate to remove from the periphery any residue remaining after the removal step.

In still another preferred embodiment, the invention is a method for the manufacture of a semi-conductive wafer, comprising the steps of applying a coating material to a top surface of the semi-conductive wafer and spinning the wafer to form a film of coating material on the top surface of the wafer; and contacting the periphery of the coated spinning wafer with an impinging stream of non-dissolving medium.

In yet another preferred embodiment, the invention is a method for the manufacture of a semi-conductive wafer, comprising the steps of applying a coating material to a top surface of the semi-conductive wafer and spinning the wafer to form a film of coating material on the top surface of the wafer; contacting the periphery of the coated spinning wafer with an impinging stream of non-dissolving medium; and applying a cleaning solution to the periphery of the spinning wafer, the cleaning solution formulated to react chemically with coated material to form a contaminant compound that can be ejected from a spinning wafer.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

FIG. 1 shows a side schematic view of a process step for applying a coating onto a substrate.

DETAILED DESCRIPTION OF THE INVENTION

In the following detailed description, reference is made to the accompanying drawings that form a part hereof and in which is shown by way of illustration, specific embodiments in which the invention may be practiced. These embodiments are described in sufficient detail to enable those skilled in the art to practice the invention, and it is to be understood that other embodiments may be utilized, and that structural, chemical and process changes may be made without departing from the spirit and scope of the present invention.

The terms "wafer" or "substrate" used in the following description include any semiconductor-based structure having a silicon surface. Wafer and substrate are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when references made to a wafer or substrate in the following description, previous process steps may have been used to form regions or junctions in the base semiconductor structure or foundation.

The current invention uses a stream of a non-dissolving medium to remove the edge bead from a substrate. The term "non-dissolving medium" is equivalent to the term "nonsolvent" and is used to designate that the material of the edge bead is substantially insoluble in the medium. The edge bead is typically formed when a coating, such as a photoresist, is applied to a substrate. The edge bead frequently has an undesired thickness or quality compared to the rest of the coating. Optionally, the inventive process also includes wet cleaning to remove residual particles remaining after the edge bead has been removed.

Figure 1:
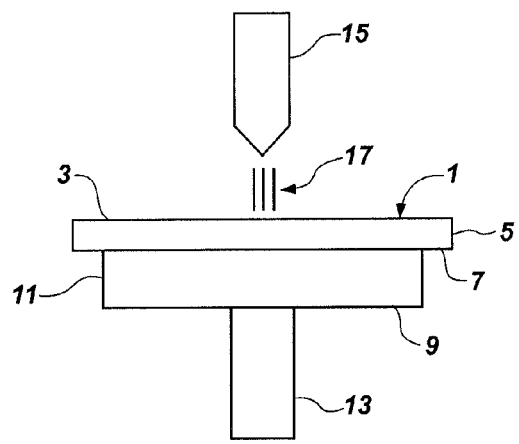
Figure 2:
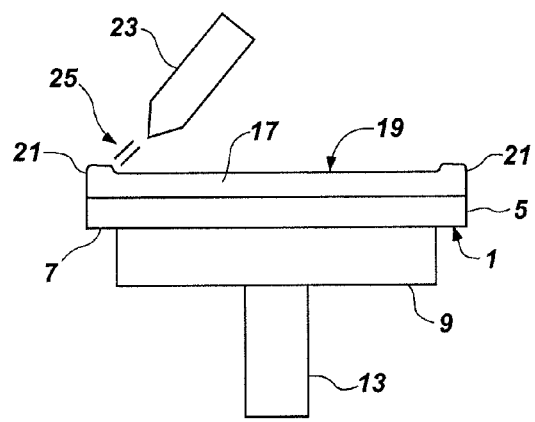
FIG. 2 shows a side view of a process step for removing the edge bead.

The substrate with the edge bead may be prepared as shown in FIG. 1. In the illustration of FIG. 1, the substrate is a wafer 1. Wafer 1 has a top surface 3, an outer edge 5, and a bottom surface 7. Wafer 1 is mounted on a vacuum mounting chuck 9 which in turn is attached to a spindle 13. Typically, outer edge 11 of vacuum mounting chuck 9 does not extend to the outer edge 5 of wafer 1. Rotation of spindle 13 causes vacuum mounting chuck 9 and wafer 1 mounted thereto to spin also. While mounted wafer 1 is either stationary or rotating at a slow speed, an application nozzle 15 applies coating material 17 to the center of wafer 1. The mounted wafer 1 is then rapidly accelerated to a high rotational speed. The centrifugal force of the rotation causes coating material 17 to spread across the entire upper surface 3 of wafer 1. Coating material 17 is typically a photoresist polymer. The spread of coating material 17 is dependent upon a number of factors including temperature of the wafer 1, temperature of coating material 17, speed of rotation, and the viscosity of coating material 17. Excess coating material 17 is ejected from edge 5 during the rotation or wraps around to edge 5 and bottom surface 7. However, as shown in FIG. 2 coating layer 19 of coating material 17 typically has edge bead 21 proximate to outer edge 5 of wafer 1. Edge bead 21 may also extend to cover outer edge 5 and the area of bottom surface 7 that is proximate to outer edge 5.

The edge bead is removed from a substrate with an edge bead, whether or not the substrate was prepared as illustrated in FIG. 1 and described above, by application of an impinging stream. Preferably, the edge bead material is sufficiently removed from the proximity of the edge to expose the top surface 3, outer edge 5 and underside 7 of the substrate. In one embodiment, as shown in FIG. 2, an air knife 23 is positioned to direct a stream 25 of a non-dissolving medium to impinge the edge bead 21 and outer edge 5 of wafer 1. Although this embodiment shows use of an air knife, any means of generating a directed high pressure stream or column of the non-dissolving medium may be used, such as a nozzle.

Air knife 23 typically includes a plurality of nozzles through which the non-dissolving medium is forced and which are aligned towards edge bead 21. Typically, the non-dissolving medium is forced through these nozzles at a high pressure. The non-dissolving medium may be any material that may be forced into a high-pressure stream and that is not a solvent for coating material 17. The non-dissolving medium may be a gas, such as for example, clean dry air, noble gas, or nitrogen. In other preferred embodiments, the non-dissolving medium is a solid/gas aerosol. Usable aerosols are known in the art, and preferably are argon or carbon dioxide aerosols.

A typical aerosol-using edge bead removal method involves cooling a gas, such as carbon dioxide or a mixture of argon and nitrogen, to near the liquefication point of the gas and spraying the cooled mixed gas through a nozzle into a low pressured chamber such that a part of the mixed gas forms solid particles. The solid particles as an aerosol in liquid and gas states collide with the edge bead, thereby removing the material of the edge bead. Aerosols and methods and nozzles for producing them, are further described in U.S. Pat. Nos. 5,062,898; 5,294,261; 5,512,106; 5,931,721; 5,810,942; and 5,853,962, all of which are incorporated herein by reference.

U.S. Pat. No. 5,062,898, discloses forming an aerosol containing argon solid particles by expanding a pressurized gaseous argon-containing stream, and removing particles or film on a surface of a specimen using the formed aerosol. Also, it is disclosed in the patent that a mixed gas containing argon gas is cooled to near the liquefication point at a fixed pressure range of 20 psi to 680 psi prior to the expanding.

U.S. Pat. No. 5,294,261, further describes the use of argon with nitrogen-containing solid particles as well as an aerosol containing argon-containing solid particles as cleaning source.

U.S. Pat. No. 5,512,106, discloses previously cooling a mixture gas containing argon gas prior to supplying the mixture gas to a nozzle, and that the mixture gas supplied to the nozzle through the pre-cooling contains liquid drops of argon. The mixture gas containing previously cooled argon liquid drops is injected into a low pressured environment through the nozzle to thereby form a fluid containing argon solid drops that are created through adiabatic expansion and the fluid is then sprayed to a surface of a specimen for the cleaning. U.S. Pat. No. 5,931,721, describes an apparatus for performing the cleaning method provided in the aforesaid U.S. Pat. No. 5,512,106.

U.S. Pat. No. 5,810,942, describes a hydrodynamic structured chamber for spraying aerosol on a surface of a specimen for the cleaning and allowing both of aerosol and objects such as particles as removed to be easily extracted.

U.S. Pat. No. 5,853,962, discloses a method injecting a high pressured liquefied $CO_2$ through a nozzle, thereby transforming the liquefied $CO_2$ into soft solid $CO_2$, and then spraying the solid $CO_2$ on a surface of a specimen, thereby removing photoresist of organic material.

Figure 3:
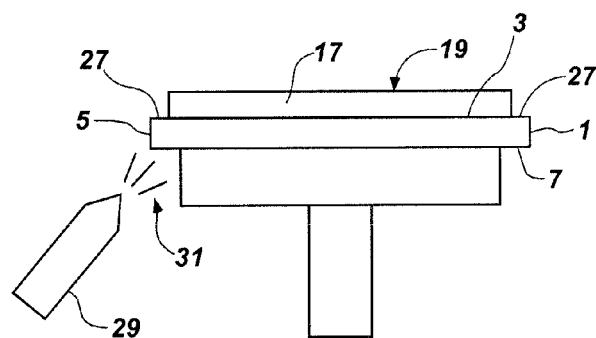
FIG. 3 shows a side view of a process step for cleaning off the edge bead residue.

As shown in FIG. 3, the stream of non-dissolving medium 25 removes edge bead 21 from the proximity of outer edge 5 of wafer 1. Removal of edge bead 21 can be, and preferably is, to such an extent that an area 27 on upper surface 3 of wafer 1 adjacent to outer edge 5 may be exposed.

Optionally, residue remaining after the removal of edge bead 21 may be removed by a wet cleaning process. One suitable wet cleaning method is disclosed in U.S. Pat. No. 6,255,228 B1, incorporated herein by reference. In this method, contaminants are removed by applying a cleaning solution to the periphery and preferably the exposed back side 7 of the wafer 1 after the edge bead 21 has been removed. A nozzle 29 ejects a cleaning solution 31 onto the bottom 7 and outer edge 5 of wafer 1. Cleaning solution 31 wicks up around outer edge 5 and onto exposed section 27 to dissolve or wash away any residual particles. The cleaning solution may be water or may by formulated to react chemically with the unwanted coating material residue to form a compound that may be ejected from the periphery of the spinning wafer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed:

1. A method of removing a bead material, the method comprising:
   applying a non-solvent, non-aerosol gas under pressure onto a bead material, the bead material comprising a photoresist material and proximate an outer edge of a substrate, wherein the non-solvent, non-aerosol gas lacks solid particles, and
   wherein the method does not comprise applying a solvent to the bead material.

2. The method of claim 1, further comprising spinning the substrate while applying the non-solvent, non-aerosol gas.

3. The method of claim 1, wherein the photoresist material comprises a polymeric material.

4. The method of claim 1, wherein the non-solvent, non-aerosol gas is selected from the group consisting of air, a noble gas, and nitrogen gas.

5. The method of claim 1, wherein applying a non-solvent, non-aerosol gas comprises applying the non-solvent, non-aerosol gas with an air knife.

6. The method of claim 1, further comprising applying a cleaning solution to a back side of the outer edge of the substrate.

7. A method of removing a bead material, the method consisting of:
   applying a stream consisting of a non-solvent, non-aerosol gas under pressure onto an outer edge of a substrate, the outer edge of the substrate comprising a bead material, to remove at least a portion of the bead material and expose the outer edge of the substrate; and
   applying a cleaning solution to the outer edge of the substrate to remove residue from the exposed outer edge of the substrate.

8. The method of claim 7, wherein applying a cleaning solution to the outer edge of the substrate comprises applying the cleaning solution to a back side of the outer edge of the substrate.

9. The method of claim 7, wherein the cleaning solution comprises water.

10. The method of claim 7, wherein applying a stream consisting of a non-solvent, non-aerosol gas under pressure onto an outer edge of a substrate comprises removing at least a portion of the bead material from a top surface, an outer edge, and a bottom surface of the substrate.

11. A method of removing a bead material, the method comprising:
    directing a pressurized stream consisting of non-aerosol gas to an outer edge of a semiconductor substrate, the outer edge of the semiconductor substrate comprising at least one bead material, wherein the at least one bead material is insoluble in the pressurized stream consisting of non-aerosol gas; and
    removing at least a portion of the at least one bead material with the pressurized stream without using a solvent.

12. The method of claim 11, wherein directing a pressurized stream consisting of non-aerosol gas comprises directing the pressurized stream consisting of non-aerosol gas through at least one of an air knife and a nozzle.

13. The method of claim 11, further comprising applying a cleaning solution to the outer edge of the substrate to remove residual particles.

14. The method of claim 13, further comprising wicking the cleaning solution from the back side of the substrate, around an outer edge of the substrate, and onto a top side of the substrate.

15. The method of claim 11, wherein the at least one bead material comprises a photoresist material.

16. A method of removing a bead of a material, the method consisting of:
    spin-coating a material on a semiconductor substrate; and
    contacting an outer edge of the semiconductor substrate with a stream of non-aerosol gas without solid particles to remove at least a portion of the material on the outer edge of the semiconductor substrate without using a solvent, the stream of non-aerosol gas comprising a non-solvent of the material.

17. The method of claim 16, wherein contacting an outer edge of the semiconductor substrate with a stream of non-aerosol gas without solid particles to remove at least a portion of the material on an outer edge of the semiconductor substrate without using a solvent comprises removing the portion of the material on the outer edge of the semiconductor substrate having a different thickness than the remainder of the material.

18. The method of claim 16, wherein the material comprises a photoresist material.

* * * * *